United States Patent
Nickel et al.

(10) Patent No.: US 9,404,965 B2
(45) Date of Patent: Aug. 2, 2016

(54) RADIO-FREQUENCY TEST SYSTEM WITH TUNABLE TEST ANTENNA CIRCUITRY

(71) Applicant: Apple Inc., Cupertino, CA (US)

(72) Inventors: Joshua G. Nickel, San Jose, CA (US); Erica J. Tong, Pacifica, CA (US); Vishwanath Venkataraman, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 117 days.

(21) Appl. No.: 14/137,770

(22) Filed: Dec. 20, 2013

(65) Prior Publication Data

US 2015/0177277 A1 Jun. 25, 2015

(51) Int. Cl.
*G01R 27/04* (2006.01)
*G01R 27/32* (2006.01)
*G01R 31/302* (2006.01)
*G01R 31/28* (2006.01)

(52) U.S. Cl.
CPC ........ *G01R 31/3025* (2013.01); *G01R 31/2822* (2013.01)

(58) Field of Classification Search
CPC .... G01R 31/002; G01R 31/302; G01R 31/20; G01R 31/28; G01R 31/282; G01R 31/2822; G01R 31/3025; G01R 29/00; G01R 29/08; G01R 29/10; H04W 24/00; H04W 24/06; H04B 17/00; H04B 1/00; H04B 1/38; H04B 1/40; H04B 1/401
USPC ................... 324/750.16, 750.26, 754, 754.31, 324/756.01, 754.03, 629, 750.01, 750.02, 324/750.18, 750.27; 343/702, 703; 455/67.12, 67.11, 226.1–226.4, 423, 455/424, 425, 67.13, 67.14, 68, 69, 115.1, 455/115.2, 418, 419, 420
See application file for complete search history.

(56) References Cited

U.S. PATENT DOCUMENTS

| | | | |
|---|---|---|---|
| 5,606,326 A * | 2/1997 | Asai | H04B 1/086 343/702 |
| 7,068,231 B2 | 6/2006 | Huang | |
| 7,925,253 B2 | 4/2011 | Breit et al. | |
| 8,588,763 B2 | 11/2013 | Venkataraman | |
| 2005/0222933 A1* | 10/2005 | Wesby | G06Q 40/00 705/36 R |
| 2006/0128373 A1* | 6/2006 | Cochrane | H04M 1/24 455/424 |

(Continued)

FOREIGN PATENT DOCUMENTS

WO 2013141873 9/2013

*Primary Examiner* — Arleen M Vazquez
*Assistant Examiner* — Steven Yeninas
(74) *Attorney, Agent, or Firm* — Treyz Law Group, P.C.; Jason Tsai; Joseph F. Guihan

(57) ABSTRACT

A test system is provided for performing radio-frequency tests on an electronic device under test (DUT) having multiple antennas. The test system may include a test unit for generating radio-frequency test signals, a test enclosure, and a test antenna fixture. The test fixture may include tunable antenna circuitry, antenna tuning elements, a test sensor, a microcontroller, a battery, and a solar cell that charges the battery, each of which is mounted on a test fixture within the test enclosure. The test sensor may be used to detect stimuli issued by the DUT. In response to detecting the stimuli, the microcontroller may send control signals to the antenna tuning elements to configure the antenna circuitry in different modes. Each of the different modes may be optimized to test a selected one of the multiple antennas in the DUT when operating using different radio access technologies and at different frequencies.

20 Claims, 9 Drawing Sheets

(56) References Cited

U.S. PATENT DOCUMENTS

| | | | | |
|---|---|---|---|---|
| 2006/0194553 A1* | 8/2006 | Ozaki | ............... | G01R 29/10 455/226.1 |
| 2011/0084887 A1* | 4/2011 | Mow | ............... | G01R 29/10 343/703 |
| 2012/0100813 A1* | 4/2012 | Mow | ............... | H04B 17/3911 455/67.12 |
| 2012/0231745 A1* | 9/2012 | Gregg | ............... | H04B 17/309 455/67.12 |
| 2012/0268153 A1* | 10/2012 | Nickel | ............... | G01R 31/3025 324/754.31 |
| 2013/0266052 A1 | 10/2013 | Yang et al. | | |
| 2013/0328581 A1* | 12/2013 | Lee | ............... | G01R 31/31924 324/750.01 |
| 2014/0155104 A1* | 6/2014 | Jarvis | ............... | G01S 5/14 455/456.5 |

\* cited by examiner

| AUDIO | ANTENNA CONFIGURATION | | | STATE |
|---|---|---|---|---|
| f1 + f3 | TA1 ON | TA2 OFF | TA3 OFF | 001 |
| f2 + f4 | TA1 OFF | TA2 ON | TA3 OFF | 010 |
| f5 + f9 | TA1 OFF | TA2 OFF | TA3 ON | 011 |
| ⋮ | | | | |

FIG. 7

| DISPLAY COLOR | ANTENNA CONFIGURATION | STATE |
|---|---|---|
| RED | PHASE SETTING #1 | 0001 |
| GREEN | PHASE SETTING #2 | 0010 |
| BLUE | PHASE SETTING #3 | 0100 |
| ⋮ | ⋮ | ⋮ |

FIG. 8

RADIO-FREQUENCY TEST SYSTEM WITH TUNABLE TEST ANTENNA CIRCUITRY

BACKGROUND

This relates generally to testing electronic devices and more particularly, to testing electronic devices that include multiple antennas.

Electronic devices often incorporate wireless communications circuitry. For example, devices may communicate using the Wi-Fi® (IEEE 802.11) bands at 2.4 GHz and 5.0 GHz. Wireless communications are also possible in cellular telephone telecommunications bands and other radio-frequency bands. In schemes such as antenna diversity schemes, an electronic device may use an array of multiple antennas to handle wireless communications.

When manufacturing such types of multi-antenna wireless devices in large volumes, the performance of the wireless communications circuitry on each device can be evaluated using a radio-frequency test station to ensure that each device satisfies design criteria. A radio-frequency test station typically includes a test host a tester (i.e., a signal generator), and an electromagnetic shielding test enclosure having a test antenna. The signal generator is connected to the test host. Arranged in this way, the test host directs the signal generator to transmit radio-frequency signals via the test antenna in the electromagnetic shielding test enclosure to a corresponding electronic device under test (DUT) during production testing.

In conventional radio-frequency test arrangements, a wireless DUT having only one antenna is placed into the electromagnetic shielding test enclosure. The test host directs the signal generator to broadcast downlink test signals to the DUT (i.e., the signal generator radiates test signals to the DUT using the test antenna in the shielding test enclosure). The DUT receives the downlink test signals using its antenna.

The DUT may be configured to analyze the received downlink test signals and to determine whether its wireless communications circuitry satisfies performance criteria. For example, the DUT can compute a receive power level based on the received downlink signals. If the receive power level is less than a predetermined threshold, the DUT is marked as a passing DUT. If the receive power level is greater than the predetermined threshold, the DUT is marked as a failing DUT.

Testing a multi-antenna device in this way may not be suitable for testing DUTs containing at least first and second antennas and may yield inaccurate results because the conventional test method holds the DUT in a fixed position within the electromagnetic shielding test enclosure. If in the fixed position the placement of the first antenna is closer to the test antenna, measurement results may be skewed towards the first antenna (i.e., test results may be more accurate for the first antenna and less accurate for the second antenna). If in the fixed position the place of the second antenna is closer to the test antenna, measurement results may be skewed towards the second antenna (i.e., test results may be more accurate for the second antenna and less accurate for the first antenna). There are also cases where the at least two antennas are both the same distance from the test antenna but the device's orientation favors one antenna compared to another due to polarization or the near or far-field pattern of the device.

It may therefore be desirable to provide improved ways for testing electronic devices having multiple antennas in a production environment.

SUMMARY

Methods for using a radio-frequency test system to characterize an electronic device under test (DUT) are provided. The test system may include a test unit that generates radio-frequency signals, a radio-frequency test enclosure, and a test fixture that is mounted within the test enclosure. The test fixture may include tunable test antenna circuitry, a microcontroller, a test sensor, a battery, and a solar cell each of which is mounted on a printed circuit board (PCB).

During testing, a DUT may be placed within the test enclosure using a holding structure that positions the DUT in a fixed predetermined location. The DUT may receive the radio-frequency test signals radiated from the tunable test antenna circuitry. The DUT may issue stimuli in accordance with a predetermined test sequence. The test sensor may serve to detect the stimuli generated from the DUT.

In response to detecting the presence of a stimulus of a given value, the test sensor may alert the microcontroller. In response to being alerted, the microcontroller may place the tunable test antenna circuitry in a predetermined state that corresponds to the given value of the stimulus. The microcontroller may adjust radio-frequency switches and/or phase shifting circuits in the tunable test antenna circuitry to place the tunable test antenna circuitry in different states.

For example, the microcontroller may place the tunable test antenna circuitry in a first state that is optimized to test a first antenna in the DUT when a stimulus of a first value is detected. The microcontroller may also place the tunable test antenna circuitry in a second state that is optimized to test a second antenna in the DUT when a stimulus of a second value is detected. The microcontroller may be powered using the battery. The battery may be charged using the solar cell.

Further features of the present invention, its nature and various advantages will be more apparent from the accompanying drawings and the following detailed description.

BRIEF DESCRIPTION OF THE DRAWINGS

FIG. 7 is a table showing how the tunable test antenna circuitry of FIG. 3 can be configured based on audio stimulus in accordance with an embodiment.

FIG. 8 is a table showing how the tunable test antenna circuitry of FIG. 3 can be configured based on display color in accordance with an embodiment.

DETAILED DESCRIPTION

Embodiments of the present invention relate to electronic devices with wireless communications circuitry. It will be recognized by one skilled in the art, that the present exemplary embodiments may be practiced without some or all of these specific details. In other instances, well-known operations have not been described in detail in order not to unnecessarily obscure the present embodiments. The wireless communications circuitry may be used to support wireless communications in multiple wireless communications bands. The wireless communications circuitry may include multiple antennas arranged to implement an antenna diversity system.

The antennas can include loop antennas, inverted-F antennas, strip antennas, planar inverted-F antennas, slot antennas, hybrid antennas that include antenna structures of more than one type, or other suitable antennas. Conductive structures for the antennas may be formed from conductive electronic device structures such as conductive housing structures, traces on substrates such as traces on plastic, glass, or ceramic substrates, traces on flexible printed circuit boards ("flex circuits"), traces on rigid printed circuit boards (e.g., fiberglass-filled epoxy boards), sections of patterned metal foil, wires, strips of conductor, other conductive structures, or conductive structures that are formed from a combination of these structures.

Figure 1:
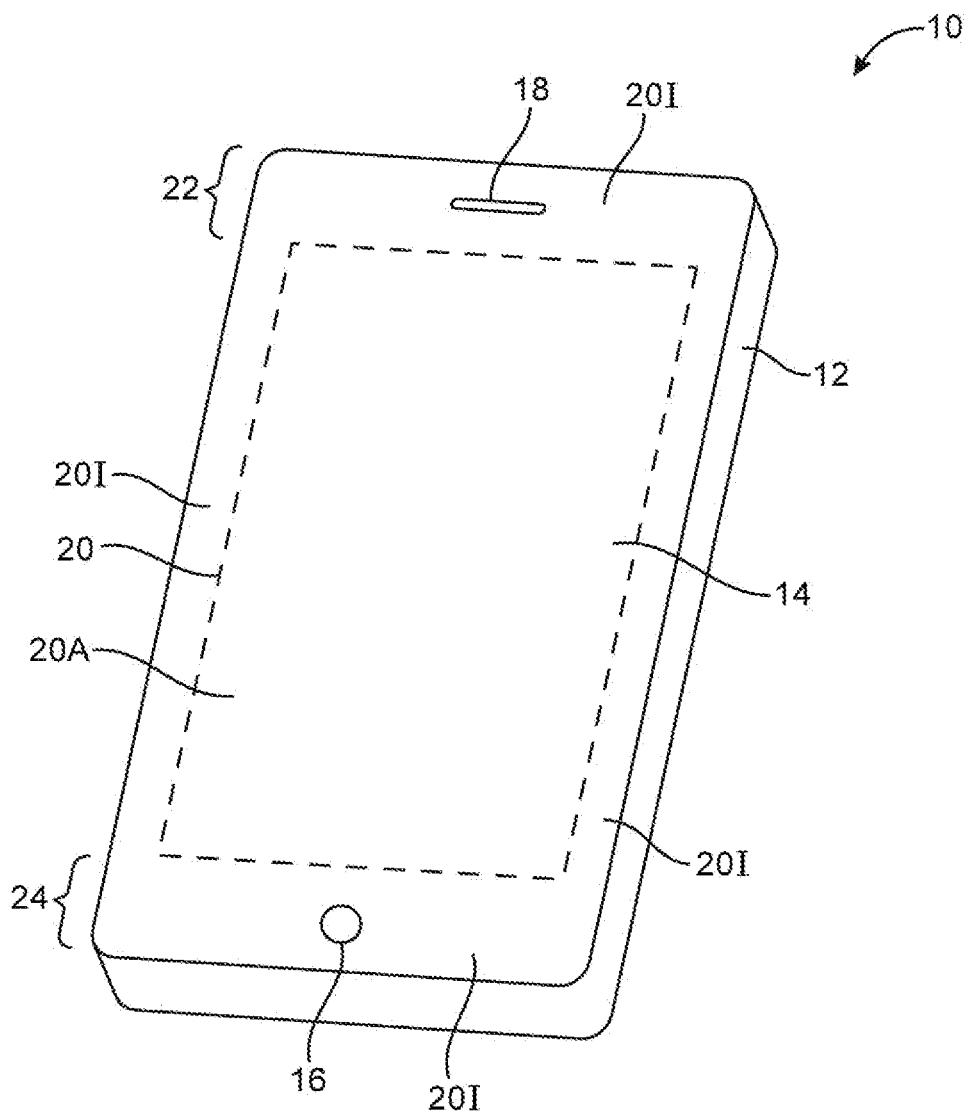
FIG. 1 is a diagram of an illustrative electronic device that is provide with multiple antennas in accordance with an embodiment.

An illustrative electronic device of the type that may be provided with one or more antennas is shown in FIG. 1. Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a cellular telephone, a media player, etc.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Device 10 may, if desired, have a display such as display 14. Display 14 may, for example, be a touch screen that incorporates capacitive touch electrodes. Display 14 may include image pixels formed form light-emitting diodes (LEDs), organic LEDs (OLEDs), plasma cells, electronic ink elements, liquid crystal display (LCD) components, or other suitable image pixel structures. A cover glass layer may cover the surface of display 14. Portions of display 14 such as peripheral regions 201 may be inactive and may be devoid of image pixel structures. Portions of display 14 such as rectangular central portion 20A (bounded by dashed line 20) may correspond to the active part of display 14. In active display region 20A, an array of image pixels may be used to display images for a user.

The cover glass layer that covers display 14 may have openings such as a circular opening for button 16 and a speaker port opening such as speaker port opening 18 (e.g., for an ear speaker for a user). Device 10 may also have other openings (e.g., openings in display 14 and/or housing 12 for accommodating volume buttons, ringer buttons, sleep buttons, and other buttons, openings for an audio jack, data port connectors, removable media slots, etc.).

Housing 12 may include a peripheral conductive member such as a bezel or band of metal that runs around the rectangular outline of display 14 and device 10 (as an example).

Antennas may be located along the edges of device 10, on the rear or front of device 10, as extending elements or attachable structures, or elsewhere in device 10. With one suitable arrangement, which is sometimes described herein as an example, device 10 may be provided with one or more antennas at lower end 24 of housing 12 and one or more antennas at upper end 22 of housing 12. Locating antennas at opposing ends of device 10 (i.e., at the narrower end regions of display 14 and device 10 when device 10 has an elongated rectangular shape of the type shown in FIG. 1) may allow these antennas to be formed at an appropriate distance from ground structures that are associated with the conductive portions of display 14 (e.g., the pixel array and driver circuits in active region 20A of display 14).

If desired, a first cellular telephone antenna may be located in region 24 and a second cellular telephone antenna may be located in region 22. Antenna structures for handling satellite navigation signals such as Global Positioning System signals or wireless local area network signals such as IEEE 802.11 (WiFi®) signals or Bluetooth® signals may also be provided in regions 22 and/or 24 (either as separate additional antennas or as parts of the first and second cellular telephone antennas).

In regions 22 and 20, openings may be formed between conductive housing structures and printed circuit boards and other conductive electrical components that make up device 10. These openings may be filled with air, plastic, or other dielectrics. Conductive housing structures and other conductive structures may serve as a ground plane for the antennas in device 10. The openings in regions 20 and 22 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element such as an inverted-F antenna resonating element formed from part of a conductive peripheral housing structure in device 10 from the ground plane, or may otherwise serve as part of antenna structures formed in regions 20 and 22.

Antennas may be formed in regions 22 and 24 that are identical (i.e., antennas may be formed in regions 22 and 24 that each cover the same set of cellular telephone bands or other communications bands of interest). Due to layout constraints or other design constraints, it may not be desirable to use identical antennas. Rather, it may be desirable to implement the antennas in regions 22 and 24 using different designs. For example, the first antenna in region 24 may cover all cellular telephone bands of interest (e.g., four or five bands) and the second antenna in region 22 may cover a subset of the four or five bands handled by the first antenna. Arrangements in which the antenna in region 24 handles a subset of the bands handled by the antenna in region 22 (or vice versa) may also be used.

In configurations in which the antennas in regions 22 and 24 are not identical, use of one antenna may be favored over the other. For example, it may be preferable to use the antenna in region 24 rather than the antenna in region 22 due to considerations such as superior efficiency, superior band coverage, superior radiation patterns, etc. In configurations such as these in which it is preferably to use the first antenna (e.g., the cellular antenna in region 24) over the second antenna (e.g., the cellular antenna in region 22), the first antenna may be referred to as the primary antenna for device 10 and the second antenna may be referred to as the secondary antenna for device 10. Device 10 may attempt to use the primary antenna as much as possible (due to factors such as superior efficiency, band coverage, or radiation pattern), but may switch to using the secondary antenna when operation of the primary antenna is disrupted. Antenna operation can be disrupted when an antenna in device 10 is blocked by an external object such as a user's hand, when device 10 is placed near objects that interfere with proper antenna operation, or due to other factors (e.g., device orientation relative to its surroundings, etc.). If desired, both the primary and secondary antennas may be used simultaneously (e.g., when receiving signals). This type of arrangement may be used, for example, to improve reception quality by combining signals that have been received using the primary antenna with signals that have been received using the secondary antenna.

Antenna diversity systems in which device 10 has a primary antenna and a secondary antenna are sometimes described herein as an example. This is, however, merely illustrative. Device 10 may use an antenna diversity arrangement that is based on three or more antennas, may use antennas that are substantially identical (e.g., in band coverage, in efficiency, etc.), or may use other types of antenna configurations.

Figure 2:
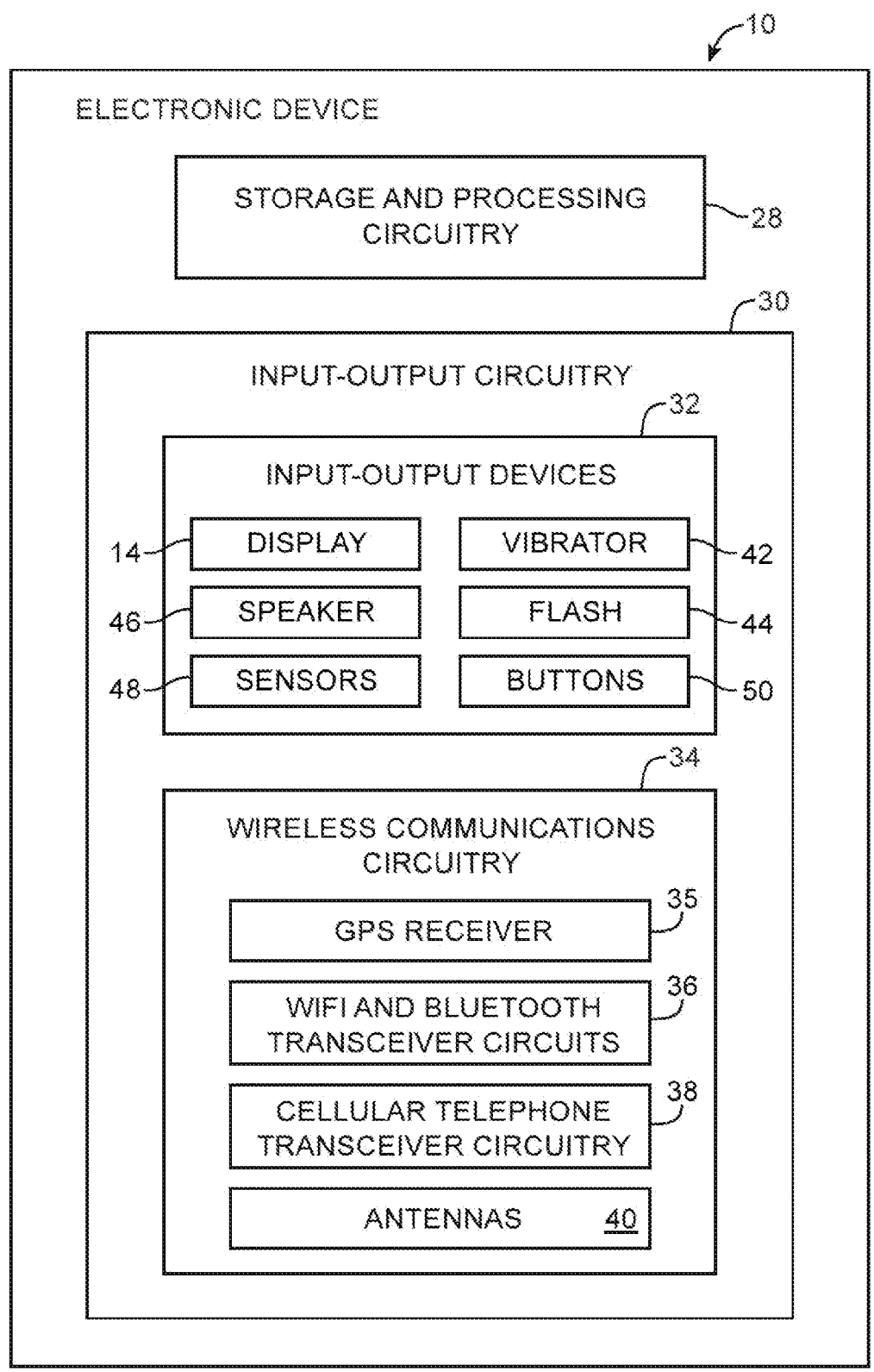
FIG. 2 is a schematic diagram of an illustrative electronic device in accordance with an embodiment.

A schematic diagram of an illustrative configuration that may be used for electronic devices 10 is shown in FIG. 2. As shown in FIG. 2, electronic device 10 may include control circuitry such as storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. The processing circuitry may be based on one or more microprocessors, microcontrollers, digital signal processors, baseband processors, power management units, audio codec chips, application specific integrated circuits, etc.

Storage and processing circuitry 28 may be used to run software on device 10, such as internet browsing applications, voice-over-internet-protocol (VOIP) telephone call applications, e-mail applications, media playback applications, operating system functions, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, satellite navigations system protocols, etc.

Input-output circuitry 30 may be used to allow data to be supplied to device 10 and to allow data to be provided from device 10 to external devices. Input-output circuitry 30 may include input-output devices 32 such as buttons 50, touch screens, joysticks, click wheels, scrolling wheels, touch pads, key pads, keyboards, light-emitting diodes and other status indicators, data ports, etc. Input-output devices 32 in circuitry 30 may also include display 14, vibrator 42, speakers such as speaker 46, light-emitting components such as camera flash 44 (sometimes referred to as a strobe or light-emitting diode), a microphone and other audio components, and other input-output devices. Input-output devices 32 may also include sensors 48. Sensors 48 may include a microphone, an ambient light sensor, proximity sensor 202, an accelerometer, compass, gyroscope or other component(s) that serves as a motion sensor, a camera, and/or other image sensor device for capturing image data.

During operation, a user can control the operation of device 10 by supplying commands through input-output devices 32 and may receive status information and other output from device 10 using the output resources of input-output devices 32 (e.g., visual information on display 14, vibrations from vibrator 42, sound from speaker 46, flashes of light from flash 44, etc.).

Wireless communications circuitry 34 may include radio-frequency (RF) transceiver circuitry formed from one or more integrated circuits, power amplifier circuitry, low-noise input amplifiers, passive RF components, one or more antennas, filters, duplexers, and other circuitry for handling RF wireless signals. Wireless signals can also be sent using light (e.g., using infrared communications).

Wireless communications circuitry 34 may include satellite navigation system receiver circuitry such as Global Positioning System (GPS) receiver circuitry 35 (e.g., for receiving satellite positioning signals at 1575 MHz) or satellite navigation system receiver circuitry associated with other satellite navigation systems. Wireless local area network transceiver circuitry such as transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as bands in frequency ranges of about 700 MHz to about 2700 MHz or bands at higher or lower frequencies. Wireless communications circuitry 34 can include circuitry for other short-range and long-range wireless links if desired. For example, wireless communications circuitry 34 may include wireless circuitry for receiving radio and television signals, paging circuits, etc. Near field communications may also be supported (e.g., at 13.56 MHz). In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may have antenna structures such as one or more antennas 40. Antenna structures 40 may be formed using any suitable antenna types (e.g., loop antennas, inverted-F antennas, strip antennas, planar inverted-F antennas, slot antennas, hybrid antennas, etc.).

Electronic devices 10 that are manufactured and assembled in a factory generally need to be tested/characterized prior to being shipped out to customers. In accordance with an embodiment, tests can be performed to ensure that the wireless performance of device 10 satisfies design criteria. During testing, many wireless devices (e.g., tens, hundreds, thousands, or more of devices 10) may be characterized in a test system such as test system 11 of FIG. 3. Electronic devices that are being tested in test system 11 may sometimes be referred to as devices under test (DUTs). Test system 11 may include test accessories, computers, network equipment, tester control boxes, cabling, test enclosures, and other test equipment for generating and receiving radio-frequency test signals and gathering test results. Test system 11 may include multiple test stations, each of which can be used to test any desired number of test stations to achieve desired test throughput.

Figure 3:
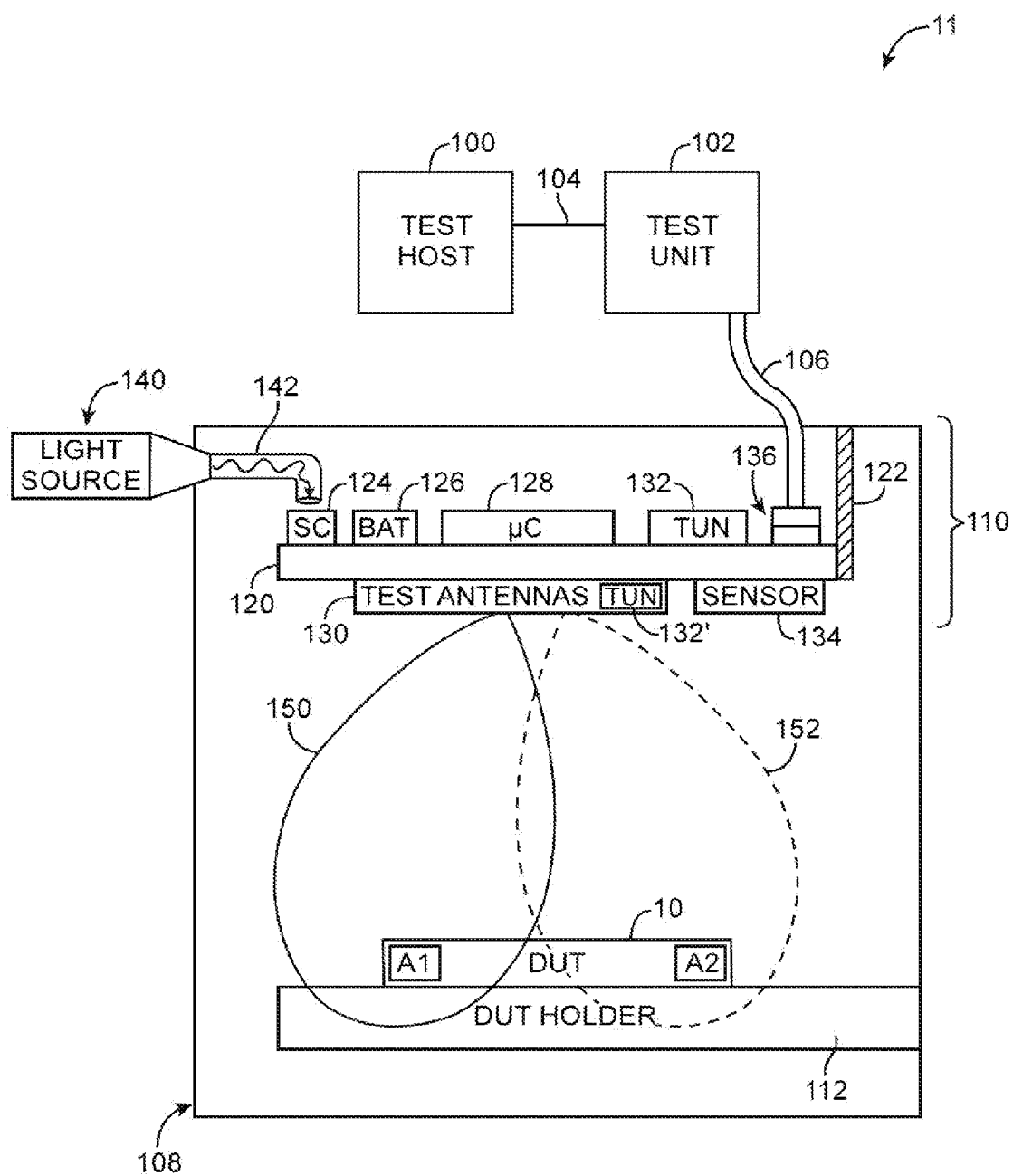
FIG. 3 is a diagram of an illustrative test system that includes tunable test antenna circuitry in accordance with an embodiment.

As shown in FIG. 3, test system 11 may include a test host such as test host 100, a tester such as test unit 102, and a radio-frequency test enclosure such as test enclosure 108. Test host 100 may, for example, be a personal computer or other types of computing equipment. Test unit 102 may be a signal generator, a spectrum analyzer, a vector network analyzer, and other testers suitable for generating radio-frequency test signals and for performing radio-frequency measurements on signals received from DUT 10. In other suitable arrangements, test unit 102 may be a radio communications tester of the type that is sometimes referred to as a call box or a base station emulator. Test unit 102 may, for example, be the CMU300 Universal Radio Communication Tester available from Rohde & Schwarz. Test unit 102 may be used to emulate the behavior of a network access point to test the ability of transceiver 36 to support the WiFi® communications protocol, the Bluetooth® communications protocol, or other communications standards. If desired, test unit 102 may be configured to emulate the behavior of a base transceiver station during a telephone call with cellular telephone transceiver circuitry 38.

Test unit 102 may be operated directly or via computer control (e.g., when test unit 102 receives commands from test host 100). When operated directly, a user may control test unit 102 by supplying commands directly to the signal generator using the user input interface of test unit 102. For example, a user may press buttons in a control panel on the signal generator while viewing information that is displayed on a display in test unit 102. In computer controlled configurations, test host 100 (e.g., software running autonomously or semi-autonomously on the computer) may communicate with test unit 102 by sending and receiving data over a wired path 104 or a wireless path between the computer and the signal generator (as an example).

During wireless testing, at least one DUT 10 may be placed on a platform such as DUT holder 112 within test enclosure 108. Test system 11 may include automatic alignment structures (not shown) for positioning DUT 10 in a predetermined position on DUT holder 112 within enclosure 108. Positioning each DUT 10 repeatedly in a fixed predetermined location in test enclosure 108 reduces the number of variables that can affect test results gathered from different DUTs.

In the example of FIG. 3, DUT 10 is electrically disconnected from test host 100 (i.e., DUT 10 is "untethered"). To support this type of untethered arrangement, DUT 10 may be loaded with a test operating system that configures DUT 10 to perform tests according to a predetermined test sequence (e.g., device 10 may be configured in list mode). The test operating system is a simplified operating system that lacks a full Internet Protocol (IP) stack implementation.

For example, consider a scenario in which DUT 10 is first placed within enclosure 108. Upon receiving an initialization signal, DUT 10 may be configured to test a first antenna 40 in DUT 10. When sufficient data has been gathered from the first antenna, DUT 10 may automatically send control signals to the test equipment and begin testing a second antenna 40 in DUT 10. Test radio-frequency signals may be conveyed between test unit 102 and DUT 10 over a non-protocol-compliant communications path (e.g., an unauthenticated wireless communications data link). DUT 10 configured in this way may be used to automatically test any suitable number of device antennas 40. If desired, DUT 10 may also be configured to run a normal user operating system (e.g., an operating system that includes a full Internet Protocol (IP) stack implementation) and may convey with test unit 102 via a protocol-compliant communications link (e.g., an authenticated wireless communications link).

Test enclosure 108 may be a shielded enclosure that is used to provide radio-frequency isolation when performing electromagnetic compatibility (EMC) radiated tests without experiencing interference from outside environment. The interior of test enclosure 108 may be lined with radio-frequency absorption material such as rubberized foam configured to minimize reflections of wireless signals. As an example, test enclosure 108 may be a pyramidal-shaped transverse electromagnetic (TEM) cell. It can also be a shielded enclosure containing one or more test antennas, one or more arrays of test antennas, one or more which can be translated or moved with respect to the device.

Referring still to FIG. 3, test unit 102 may be coupled to test antenna fixture 110 that is mounted within test enclosure 108 via a radio-frequency cable 106 (e.g., a coaxial cable). Test antenna fixture 110 may include a substrate such as printed circuit board (PCB) 120 that is supported within enclosure 108 using an antenna support member 122. Radio-frequency test cable 106 may be coupled to conductive traces formed on board 120 via radio-frequency connectors 136.

Each of the multiple antennas 40 in DUT 10 may be tested using test system 11. In the example of FIG. 3. DUT 10 has a first antenna A1 located at one end of the device and a second antenna A1 located at the other end of the device. Testing both of the device antennas A1 and A2 using antenna fixture 110 in a single state may tend to skew results towards either antenna A1 or antenna A2 (e.g., test results may be more accurate for antenna A2 and less accurate for antenna A1, or vice versa).

Changing the orientation DUT 10 with respect to fixture 110 is one way of reducing this undesired skew (e.g., DUT 10 may be positioned in a first orientation that places antenna A1 closer to fixture 110 when testing antenna A1 and may be positioned in a second orientation that places antenna A2 closer to fixture 110 when testing antenna A2). In certain scenarios, it may not be desirable to move DUT 10 within enclosure 108 at all during testing. In such scenarios, test fixture 110 may be tunable and may be placed in a first state when testing A1 and may be placed in a second state when testing A2. When operated in the first state, fixture 110 may generate a beam pattern 150 that is optimized for testing A1. When operating in the second state, fixture 110 may steer the beam to a new direction 152 that is optimized for testing A2. Configured in this way, test antenna fixture 110 may be placed in different operating states (or modes) each of which is used to test a respective antenna 40 in device 10.

Fixture 110 may further include tunable test antenna circuitry 130 and associated antenna tuning elements (e.g., antenna tuning elements 132 that are separately coupled to test antenna circuitry 130 and antenna tuning elements 132' that are formed as part of antenna circuitry 130), a test sensor such as test sensor 134, a processing device such as microcontroller 128, a battery 126, and a solar cell 124 that are mounted on substrate 120. Radio-frequency test signals generated using test unit 102 may be transmitted to DUT 10 via cable 106 and test antenna circuitry 130 (see, e.g., arrow 164 in FIG. 4). Similarly, radio-frequency signals transmitted by the antennas of DUT 10 may be received using antenna circuitry 130.

While test unit 102 is generating the RF test signals, DUT 10 may receive the corresponding test signals and compute desired RF performance metrics that reflect the quality of received signals. Examples of signal quality measurements that may be made in DUT 10 include bit error rate measurements, signal-to-noise ratio measurements, measurements on the amount of power associated with incoming wireless signals, channel quality measurements based on received signal strength indicator (RSSI) information (RSSI measurements), channel quality measurements based on received signal code power (RSCP) information (RSCP measurements), channel quality measurements based on signal-to-interference ratio (SINR) and signal-to-noise ratio (SNR) information (SINR and SNR measurements), channel quality measurements based on signal quality data such as Ec/Io or Ec/No data (Ec/Io and Ec/No measurements), etc. If desired, one or more test antennas or array of test antennas in test system 11 may be used to gather power measurements, which can be used to determine the total radiated power (TRP) using spatial averaging computations.

Microcontroller 128 may have a power supply terminal that receives power supply voltage signals (e.g., positive power supply voltage signals and ground power supply voltage signals) from battery 126 via power supply line 127. Battery 126 may be charged using solar cell 124. Solar cell 124 may receive light via an optical tube 142 coupled to an external light source 140 (see, FIG. 3). Light source 140 may periodically generate light to charge solar cell 124. Charging battery 126 in this way reduces the amount of metal wiring that needs to be routed into test enclosure 108, which helps to minimize interference with the wireless testing. This example in which light is used charge battery 126 is merely illustrative. If desired, other ways of providing power to microcontroller 128 may be implemented.

Figure 4:
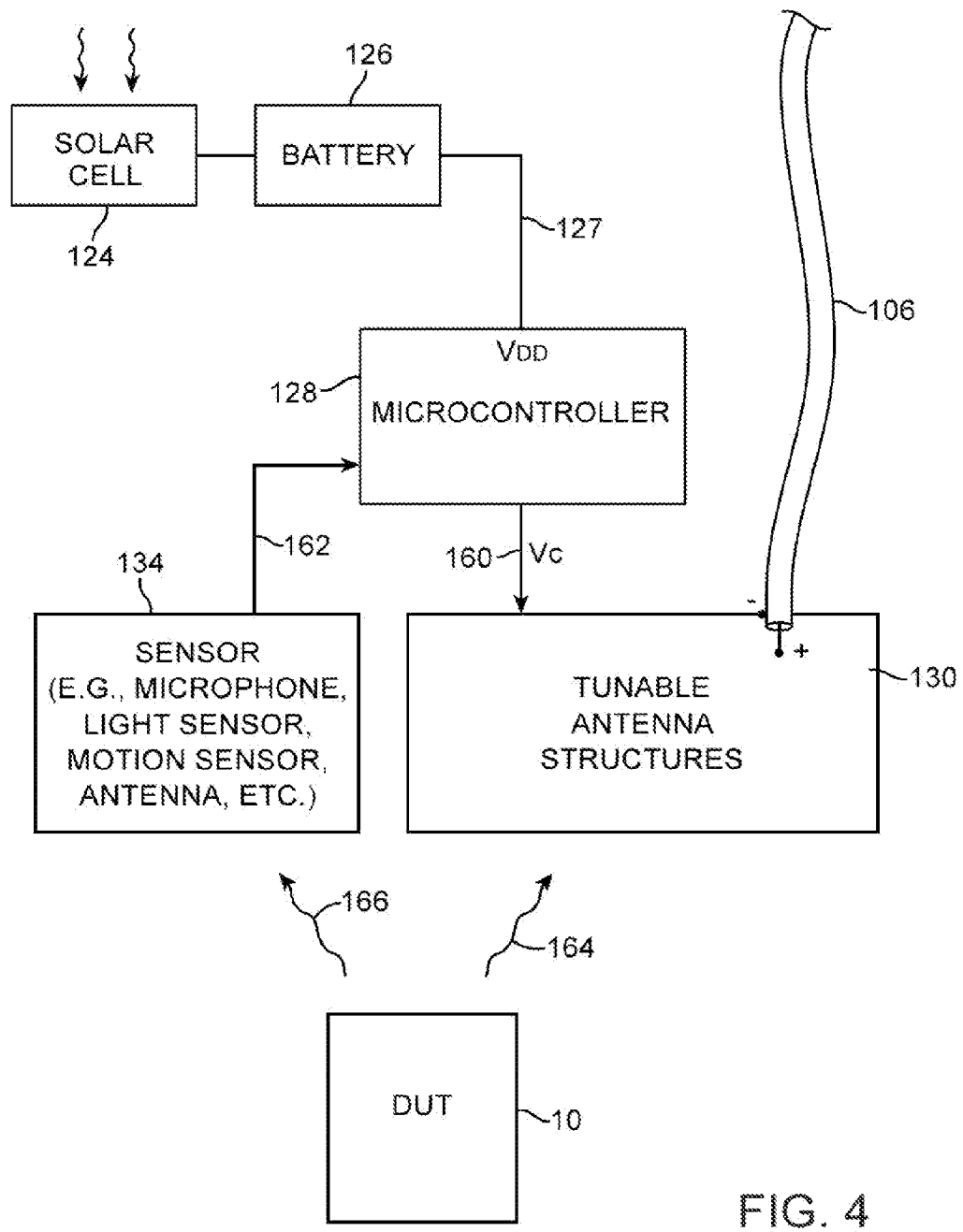
FIG. 4 is a diagram showing how a microcontroller in the test system of FIG. 3 can be used to control the tunable test antenna circuitry in accordance with an embodiment.

Test sensor 134 may serve to detect some stimulus generated by DUT 10 (see, e.g., arrow 166 in FIG. 4). As shown in FIG. 4, sensor 134 may be a microphone for detecting audio signals emitted from DUT 10, a light sensor for detecting light emitted from DUT 10 (e.g., a light sensor for monitoring the presence/absence of light, the brightness of the light, the color of the light, the frequency at which light is pulsed, etc.), a motion sensor for detecting any vibrations at DUT 10, an auxiliary test antenna for receiving wireless test signals at in a predetermined radio-frequency channel, and other types of sensors for receiving other suitable stimuli from DUT 10. Configured in list mode, DUT 10 may periodically generate a stimulus indicating the start of a new test state.

In response to detecting the stimulus from DUT 10, sensor 134 may send microcontroller 128 an enable signal to alert microcontroller 128 via path 162. In general, microcontroller 128 may be any general processing device formed using programmable logic devices, application specific standard products (ASSPs), and application specific integrated circuits (ASICs), just to name a few. In response to receiving the enable signal from sensor 134, microcontroller 128 may send control signals Vc to tunable antenna circuitry 130 via path 160. Control signals Vc may configure tunable antenna circuitry 130 in a desired state by the adjusting antenna tuning elements (e.g., antenna tuning elements 132 and 132' in FIG. 3).

Sensor 134 may send different types of enable signals to microcontroller 128, which may in turn generate different corresponding control signals Vc. For example, DUT 10 may issue a first stimulus, which would trigger sensor 134 to send microcontroller 128 a first type of enable signal, thereby directing microcontroller 128 to output first control signals Vc that places tunable test antenna structures in a first state optimized to test a selected antenna in DUT 10. At another time, DUT 10 may issue a second stimulus, which would trigger sensor 134 to send microcontroller 128 a second type of enable signal, thereby directing microcontroller 128 to output second control signals Vc that places tunable test antenna structures in a second state optimized to test another antenna in DUT 10.

Figure 5:
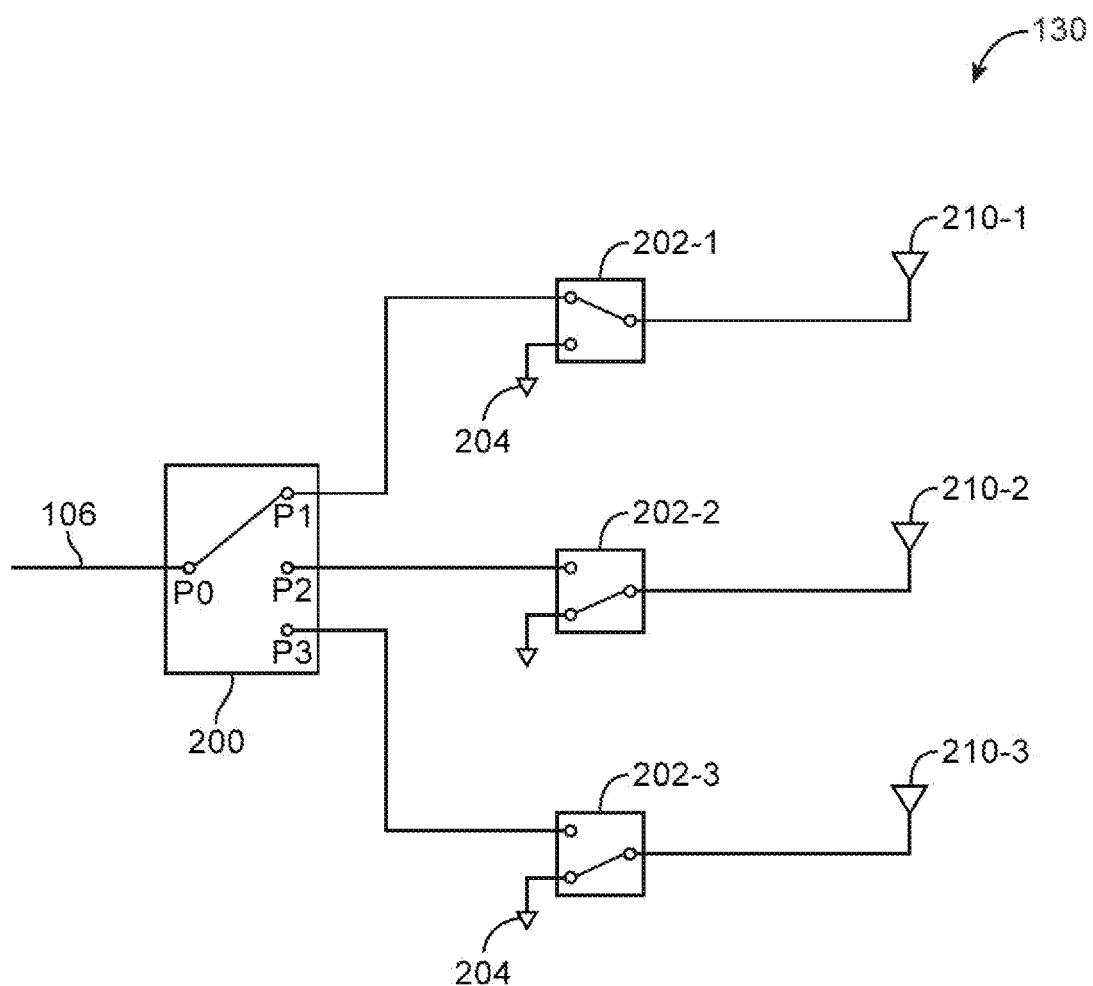
FIG. 5 is a diagram of tunable test antenna circuitry implemented using radio-frequency switches in accordance with an embodiment.

FIG. 5 is a diagram showing tunable antenna circuitry 130 implemented using radio-frequency switches. The switches themselves may be considered antenna tuning elements. As shown in FIG. 5, antenna circuitry 130 include a first test antenna 210-1 that is coupled to a first switch 202-1, a second test antenna 210-2 that is coupled to a second switch 202-2, a third test antenna 210-3 that is coupled to a third switch 202-3, and a shared switch 200. Switches 202-1, 202-2, and 202-3 may be single-pole dual-throw radio-frequency switches, whereas switch 200 may be a single-pole triple-throw radio-frequency switch (as an example). Configured in this way, cable 106 may be coupled to a selected one of the three test antennas via switch 200 while the other unselected antennas are coupled to ground 204. This is merely illustrative and does not serve to limit the scope of the present invention. If desired, circuitry 130 may include any number of test antennas and associated single-pole multi-throw RF switches.

Figure 6:
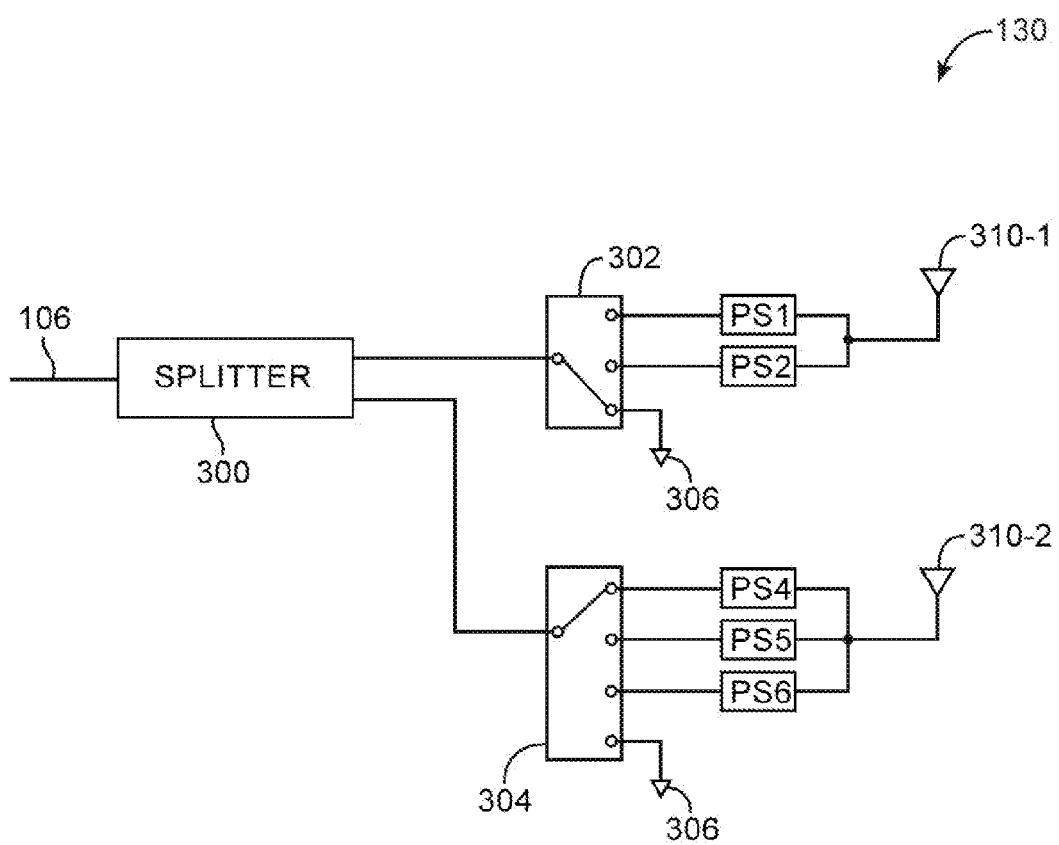
FIG. 6 is a diagram of tunable test antenna circuitry implemented using phase shifters in accordance with an embodiment.

FIG. 6 is a diagram showing tunable antenna circuitry 130 implemented using RF switches and phase shift circuits (e.g., circuits for introducing phase delay into signals). As shown in FIG. 5, antenna circuitry 130 may include a first antenna 310-1 that is coupled to RF switch 302 via phase shifters PS1 and PS2, a second antenna 310-2 that is coupled to RF switch 304 via phase shifters PS4, PS5, and PS6, and a shared radio-frequency splitter circuit 300. Signals routed through cable 106 may be split using circuit 300, a first portion of which is routed to switch 302 via a first transmit path and a second portion of which is routed to switch 304 via a second transmit path.

In this example, switch 302 may be a single-pole triple-throw RF switch, whereas switch 304 may be a single-pole four-throw RF switch. At least one of antennas 310-1 and 310-2 should be coupled to splitter 300. In a first mode, antenna 310-1 may be coupled to splitter 300 via a selected one of phase shifters PS1 and PS2 while antenna 310-2 is decoupled from splitter 300 (e.g., while the second transmit path is coupled to ground 306 via switch 304). In a second mode, antenna 310-2 may be coupled to splitter 300 via a selected one of phase shifters PS4, PS5, and PS6 while antenna 310-1 is decoupled from splitter 300 (e.g., while the first transmit path is coupled to ground 306 via switch 302). In yet another mode, antenna 310-1 may be coupled to splitter 300 via a selected one of phase shifters PS1 and PS2 while antenna 310-2 is coupled to splitter 300 via a selected one of phase shifters PS4, PS5, and PS6.

In general, tunable test antenna circuitry 130 may be formed using any number of RF switches, phase shifting circuits, matching circuits, filters, multiplexers, test antennas, and associated antenna tuning elements. Fixture 110 may be configured in a selected one of the different possible modes using appropriate control signals generated by microcontroller 128. The control signals generated by microcontroller 128 may, for example, adjust the directionality of gain, the magnitude of gain, and the polarization of radio-frequency signals output using the different test antennas. Each of the different modes may be optimized to test a respective antenna in DUT 10. If desired, fixture 110 may also be configured in different states when testing different wireless communications technologies/protocols or when testing different radio-frequency bands.

As described above, DUT 10 may generate stimuli of different values that configure fixture 110 to operate in different corresponding modes. FIG. 7 shows an example in which DUT 10 generates audio signals according to a predetermined test sequence. As shown in FIG. 7, DUT 10 may generate audio signals at frequencies f1 and f3 to only activate test antenna TA1 (while remaining test antennas TA2 and TA3 are deactivated). This configuration may correspond to a first state (001) that is optimized for testing a first radio access technology. At another point in time, DUT 10 may generate audio signals at frequencies f2 and f4 to only activate test antenna TA2 (while remaining test antennas TA1 and TA3 are deactivated). This configuration may correspond to a second state (010) that is optimized for testing a second radio access technology. At yet another point in time, DUT 10 may generate audio signals at frequencies f5 and f9 to only activate test antenna TA3 (while remaining test antennas TA1 and TA2 are deactivated). This configuration may correspond to a third state (011) that is optimized for testing a third radio access technology. If desired, DUT 10 may generate other audio signals for placing fixture 110 in any suitable test state.

In another suitable arrangement, DUT 10 may use display 14 (FIG. 1) to output different display color values according to a predetermined test sequence. As shown in FIG. 8, DUT 10 may display a red color that results in circuitry 130 to operate using a first phase setting that is optimized for testing a first radio-frequency channel. At another point in time, DUT 10 may display a green color that results in circuitry 130 to operate using a second phase setting that is optimized for testing a second radio-frequency channel. At yet another point in time, DUT 10 may display a blue color that results in circuitry 130 operating using a third phase setting that is optimized for testing a third radio-frequency channel. If desired, DUT 10 may output other display colors for placing circuitry 130 in any suitable test mode.

The examples of FIGS. 7 and 8 in which DUT 10 generates audio and visual stimuli is merely illustrative and does not serve to limit the scope of the present invention. If desired, DUT 10 may issue other stimulus by varying the number/frequency of vibrations using vibrator 42, the number/frequency of blinks using flash 44, different types of sounds using speaker 46, and different types of visual content using display 14 (as examples). Depending on the type of stimulus that DUT 10 issues, an appropriate type of test sensor 134 may be included as part of test fixture 110 to detect that particular type of stimulus. For example, test sensor 134 may be a camera that serves to monitor the display color output by DUT 10 in the example of FIG. 8.

Figure 9:
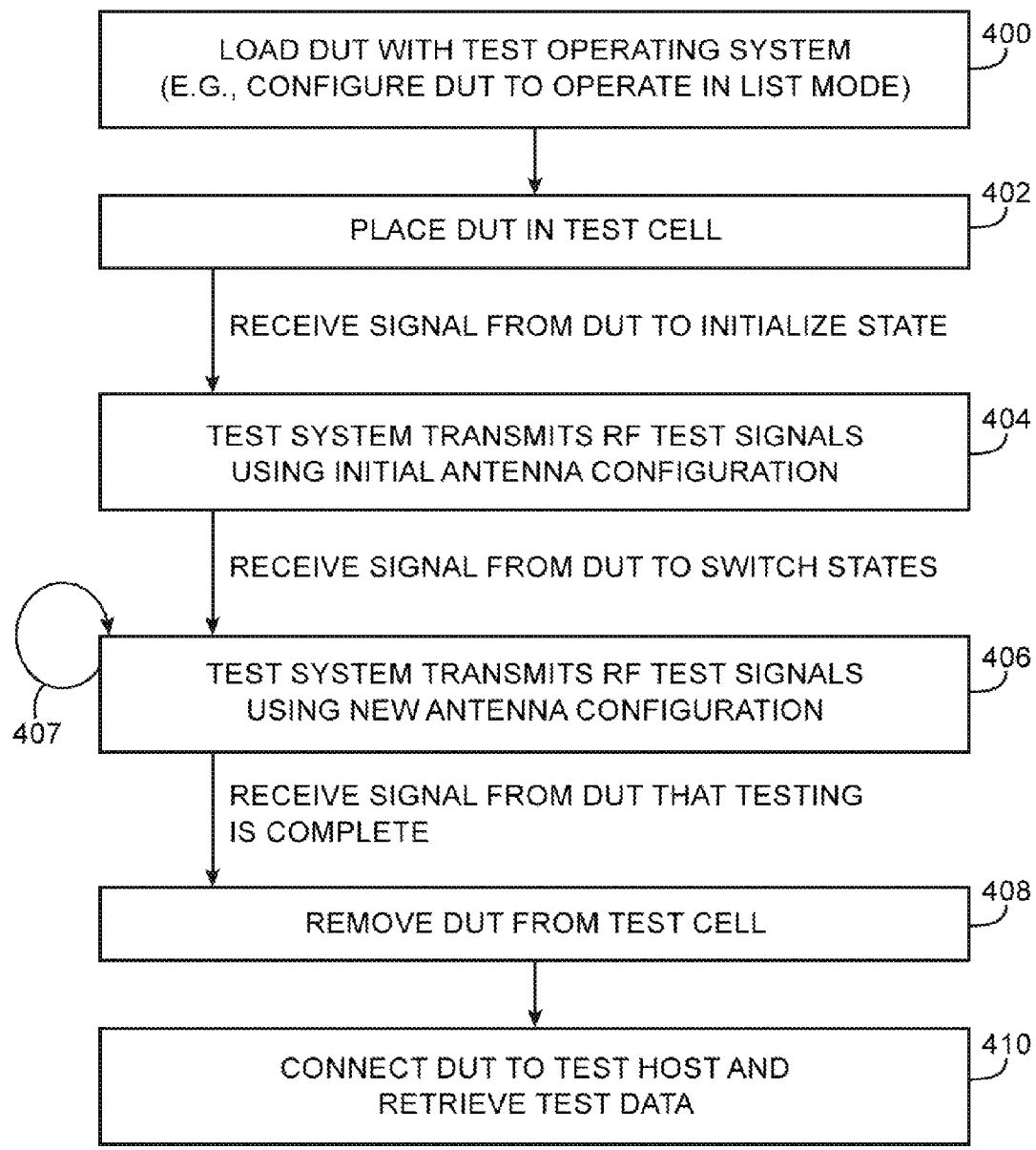
FIG. 9 is a flow chart of illustrative steps involved in operating a test system of the type shown in FIG. 3 in accordance with an embodiment.

FIG. 9 is a flow chart of illustrative steps involved in operating a test system of the type described in connection with FIG. 3. At step 400, DUT 10 may be loaded with a test operating system to configured DUT 10 in a list mode. At step 402, DUT 10 may be placed within test cell 108.

At step 404, test antenna fixture 110 may transmit RF test signals to DUT 10 using an initial antenna configuration (e.g., DUT 10 may receive initialization signals generated using test unit 102). In response to receiving the initialization signals, DUT 10 may issue a stimulus. When test sensor 134 detects the stimulus, fixture 110 may transmit RF test signals to DUT 10 using a new antenna configuration (step 406). DUT 10 may serve to gather test data when fixture 110 is operating in different modes by (a) periodically issuing stimulus signals to sensor 134 according to a predetermined test sequence (or list), as indicated by loop 407.

When DUT 10 has looped through the entire test sequence, DUT 10 may issue a stimulus that signals the completion of testing. At this point, DUT 10 may be removed from test cell 108 (step 408). DUT 10 may then be connected to test host 100 via a wire to retrieve the test data that is stored on DUT 10. Test host 100 may then determined whether DUT 10 is a satisfactory DUT or a failing DUT based on the gathered test results. A satisfactory DUT may be packaged and shipped to customers. A failing DUT may be sent for rework or may be scrapped.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for using a test system to characterize a device under test, wherein the test system includes a sensor, a controller, and tunable test antenna circuitry that includes at least one test antenna coupled to at least one antenna tuning element, the method comprising:
    with the sensor, detecting a stimulus of a given value from the device under test;
    in response to detecting the stimulus, alerting the controller with the sensor;
    in response to being alerted, placing the tunable test antenna circuitry in a selected one of a plurality of predetermined states with the controller, wherein the given value of the stimulus indicates which of the plurality of predetermined states to make the selected state; and
    while the tunable test antenna circuitry is placed in the selected one of the plurality of predetermined states, transmitting radio-frequency test signals to the device under test using the at least one test antenna, wherein the sensor comprises a sensor selected from the group consisting of: a microphone, a visible light sensor, a motion sensor, and a camera.

2. The method defined in claim 1, further comprising:
    loading the device under test with a test operating system so that the device under test generates stimuli according to a predetermined test sequence.

3. The method defined in claim 1, further comprising:
    placing the device under test within a radio-frequency test cell.

4. The method defined in claim 3, wherein the test system further includes a test host, the method further comprising:
    removing the device under test from the radio-frequency test cell;
    after the device under test has been removed from the radio-frequency test cell, connecting the device under test to the test host;
    while the device under test is connected to the test host, retrieving test data from the device under test; and
    with the test host, determining whether the device under test is a passing device based on the retrieved test data.

5. The method defined in claim 3, wherein placing the device under test within the radio-frequency test cell comprises placing the device under test within a transverse electromagnetic cell.

6. The method defined in claim 1, further comprising:
    placing the tunable test antenna circuitry in a first state that is optimized for testing a first radio access technology with which the device under test is operated; and
    placing the tunable test antenna circuitry in a second state that is optimized for testing a second radio access technology with which the device under test is operated.

7. The method defined in claim 1, wherein placing the tunable test antenna circuitry in a selected one of the plurality of predetermined states with the controller comprises using the controller to adjust at least one radio-frequency switch in the tunable test antenna circuitry.

8. The method defined in claim 7, wherein placing the tunable test antenna circuitry in a selected one of the plurality of predetermined states with the controller comprises using the controller to adjust at least one phase shift circuit in the tunable test antenna circuitry.

9. The method defined in claim 1, wherein the test system includes a microcontroller, a solar cell mounted on a substrate, and a battery mounted on the substrate, and wherein placing the tunable test antenna circuitry in a selected one of the plurality of predetermined states with the controller comprises using the microcontroller to tune the tunable test antenna circuitry, the method further comprising:
    powering the microcontroller with the battery; and
    charging the battery with the solar cell.

10. The method defined in claim 1, further comprising:
with the device under test, receiving the radio-frequency test signals from the at least one test antenna and computing performance metrics that reflect the quality of the received radio-frequency test signals.

11. The method defined in claim 10, wherein the at least one antenna tuning element comprises a tuning element selected from the group consisting of: a switch and a phase shift circuit.

12. A method for using a test system to characterize a device under test, wherein the test system includes a sensor, a controller, and tunable test antenna circuitry formed separately from the sensor, wherein the sensor comprises a sensor selected from the group consisting of: a microphone, a visible light sensor, a motion sensor, and a camera, the method comprising:
with the sensor, detecting a stimulus from the device under test;
in response to detecting the stimulus, alerting the controller with the sensor;
in response to being alerted, placing the tunable test antenna circuitry in a selected one of a plurality of predetermined states with the controller;
while the tunable test antenna circuitry is placed in the selected one of the plurality of predetermined states, transmitting radio-frequency test signals to the device under test using the tunable test antenna circuitry; and
with the device under test, receiving the radio-frequency test signals from the at least one test antenna and computing performance metrics that reflect the quality of the received radio-frequency test signals.

13. The method defined in claim 12, wherein the device under test has first and second opposing ends, the device under test has a first antenna located at the first end, and the device under test has a second antenna located at the second end.

14. The method defined in claim 13, wherein transmitting radio-frequency test signals to the device under test while the tunable test antenna circuitry is placed in the plurality of predetermined states comprises transmitting radio-frequency test signals in a first predetermined state and a second predetermined state, the first antenna is tested when the tunable test antenna circuitry is placed in the first predetermined state, the second antenna is tested when the tunable test antenna circuitry is placed in the second predetermined state, and placing the tunable test antenna circuitry in a selected one of a plurality of predetermined states with the controller in response to being alerted comprises switching the tunable test antenna circuitry from the first predetermined state to the second predetermined state in response to being alerted.

15. The method defined in claim 14, wherein the radio-frequency test signals are transmitted to the first antenna with a first beam pattern when the tunable test antenna circuitry is placed in the first predetermined state, the radio-frequency test signals are transmitted to the second antenna with a second beam pattern when the tunable test antenna circuitry is placed in the second predetermined state, and the first beam pattern is different than the second beam pattern.

16. The method defined in claim 14, wherein the tunable test antenna circuitry transmits radio-frequency test signals in a first direction when the tunable test antenna circuitry is placed in the first predetermined state and the tunable test antenna circuitry transmits radio-frequency test signals in a second direction that is different than the first direction when the tunable test antenna circuitry is placed in the second predetermined state.

17. The method defined in claim 14, wherein only the first antenna is tested when the tunable test antenna circuitry is placed in the first predetermined state and only the second antenna is tested when the tunable test antenna circuitry is placed in the second predetermined state.

18. A method for using a test system to characterize a device under test, wherein the test system includes a sensor, a controller, and tunable test antenna circuitry that includes at least one test antenna coupled to at least one antenna tuning element, and the sensor comprises a sensor selected from the group consisting of: a microphone, a visible light sensor, a motion sensor, and a camera, the method comprising:
loading the device under test with a test operating system so that the device under test generates stimuli according to a predetermined test sequence;
placing the device under test within a radio-frequency test cell;
while the tunable test antenna circuitry is placed in a first predetermined state of a plurality of predetermined states, transmitting radio-frequency test signals to the device under test using the at least one test antenna;
with the device under test, receiving the radio-frequency test signals from the at least one test antenna and computing performance metrics that reflect the quality of the received radio-frequency test signals;
with the sensor, detecting a stimulus of the predetermined test sequence of stimuli, wherein the stimulus has a given value;
in response to detecting the stimulus, placing the tunable test antenna circuitry in a second predetermined state of the plurality of predetermined states with the controller, wherein the given value of the stimulus causes the controller to place the tunable test antenna circuitry in the second predetermined state;
while the tunable test antenna circuitry is placed in the second predetermined state, transmitting additional radio-frequency test signals to the device under test using the at least one test antenna; and
with the device under test, receiving the additional radio-frequency test signals from the at least one test antenna and computing additional performance metrics that reflect the quality of the received additional radio-frequency test signals.

19. The method defined in claim 18, wherein the device under test has first and second opposing ends, the device under test has a first antenna located at the first end, the device under test has a second antenna located at the second end, only the first antenna is tested when the tunable test antenna circuitry is placed in the first predetermined state, and only the second antenna is tested when the tunable test antenna circuitry is placed in the second predetermined state.

20. The method defined in claim 19, wherein the radio-frequency test signals are transmitted to the first antenna with a first beam pattern when the tunable test antenna circuitry is placed in the first predetermined state, the radio-frequency test signals are transmitted to the second antenna with a second beam pattern when the tunable test antenna circuitry is placed in the second predetermined state, and the first beam pattern is different than the second beam pattern.

* * * * *